United States Patent
Hust et al.

(10) Patent No.: US 12,292,482 B2
(45) Date of Patent: May 6, 2025

(54) METHOD FOR DETERMINING THE AGEING OF AN INDIVIDUAL BATTERY CELL AS WELL AS A METHOD FOR CONTROLLING A BATTERY

(71) Applicant: Mercedes-Benz Group AG, Stuttgart (DE)

(72) Inventors: Friedrich Emanuel Hust, Esslingen (DE); Heiko Witzenhausen, Esslingen (DE)

(73) Assignee: Mercedes-Benz Group AG, Stuttgart (DE)

( * ) Notice: Subject to any disclaimer, the term of this patent is extended or adjusted under 35 U.S.C. 154(b) by 0 days.

(21) Appl. No.: 18/868,636

(22) PCT Filed: Feb. 22, 2024

(86) PCT No.: PCT/EP2024/054539
§ 371 (c)(1),
(2) Date: Nov. 22, 2024

(87) PCT Pub. No.: WO2024/199836
PCT Pub. Date: Oct. 3, 2024

(65) Prior Publication Data
US 2025/0110184 A1    Apr. 3, 2025

(30) Foreign Application Priority Data
Mar. 29, 2023    (DE) .................. 10 2023 001 210.6

(51) Int. Cl.
*H02J 7/00* (2006.01)
*G01R 31/392* (2019.01)
*G01R 31/396* (2019.01)

(52) U.S. Cl.
CPC ......... *G01R 31/392* (2019.01); *G01R 31/396* (2019.01); *H02J 7/007182* (2020.01)

(58) Field of Classification Search
USPC ........................................... 320/134
See application file for complete search history.

(56) References Cited

U.S. PATENT DOCUMENTS

| 10,067,198 B2 * | 9/2018 | Maluf .................. H02J 7/0048 |
| 2014/0139192 A1 | 5/2014 | Berkowitz et al. |

(Continued)

FOREIGN PATENT DOCUMENTS

DE    10 2021 113 456 A1    12/2022

OTHER PUBLICATIONS

International Search Report (PCT/ISA/210) issued in PCT Application No. PCT/EP2024/054539 dated May 27, 2024, with English translation (5 pages).

(Continued)

*Primary Examiner* — Samuel Berhanu
(74) *Attorney, Agent, or Firm* — Crowell & Moring LLP

(57) ABSTRACT

A method for determining ageing of an individual battery cell of a lithium-ion battery. The battery cell is actively charged or discharged with a power pulse, or such a power pulse charging or discharging is detected during operation of the battery, where an occurring current pulse and a voltage response of the battery cell are recorded in an idle phase following the power pulse with lower power or without power and a relaxation of the battery cell is evaluated, where a relaxation time constant is determined and stored, after which a charging curve and a discharging curve is formed over the charge of the battery cell from the currently detected and stored relaxation time constant when charging or discharging the battery cell by the power pulse, where a current capacity of the battery cell is deduced on a basis of a point where the charging and discharging curves intersect.

13 Claims, 2 Drawing Sheets

(56) References Cited

U.S. PATENT DOCUMENTS

2015/0377976 A1   12/2015  Maluf et al.
2020/0011933 A1*  1/2020  Otagiri ................ G01R 31/388
2021/0382114 A1   12/2021  Oyama et al.

OTHER PUBLICATIONS

German-language Written Opinion (PCT/ISA/237) issued in PCT Application No. PCT/EP2024/054539 dated May 27, 2024, with English translation (8 pages).
German-language German Office Action issued in German Application No. 10 2023 001 210.6 dated Feb. 14, 2024 (7 pages).
Friedrich Emanuel Hust "Physico-Chemically Motivated Parameterization and Modelling of Real-Time Capable Lithium-Ion Batter Models—a Case Study on the Tesla Model S Battery", *Aacher Contributions of the ISEA*, Jan. 1, 2019, pp. 1-218, URL: https://publications.rwth-aachen.de/record/752755/files/752755.pdf, XP093161274 (12 pages).

* cited by examiner

METHOD FOR DETERMINING THE AGEING OF AN INDIVIDUAL BATTERY CELL AS WELL AS A METHOD FOR CONTROLLING A BATTERY

BACKGROUND AND SUMMARY OF THE INVENTION

The invention relates to a method for determining the ageing of an individual battery cell of a lithium-ion battery. Furthermore, the invention relates to a method for controlling a battery according to the type defined in more detail herein.

Current lithium-ion batteries, such as are frequently used as high energy batteries for the electric power supply of motor vehicles, are often based on nickel-manganese-cobalt electrodes and graphite electrodes. In particular, the graphite electrode has an ageing effect which concerns the performance of the entire battery or its individual battery cells. In order to counteract these ageing effects already in the life cycle of the battery, in order to at least prevent accelerated ageing, corresponding indicators for such ageing factors have to be measured and correctly interpreted.

A frequently used analysis technique is the so-called differential voltage analysis (DVA). With the aid of this technique, the homogeneity of the lithium distribution inside of the battery can be determined. However, the technique requires a full charge and a complete discharge with as low and constant a current as possible. This is rarely possible in real-life use, in particular when used in a motor vehicle, since here charging is carried out as fast as possible, i.e., with a high current, and therefore always on the edge of the stability window, i.e., directly before the range in which formation of a surface layer on the anode would occur. In the discharge direction, a similarly high dynamic is present, often interrupted by short charging cycles, since there is often a very strong discharge when accelerating and recuperation, i.e., recharging of the battery, when braking again. This means that, on the one hand, there is no constant load, and, on the other hand, the direction of the current is constantly changing. These conditions that occur in practice are therefore unsuitable in principle for differential voltage analysis. This makes it more difficult to recognize ageing mechanisms during operation and, if they cannot be recognized, they cannot be counteracted efficiently.

In the dissertation of one of the inventors, entitled Physico-chemically motivated parameterization and modelling of real-time capable lithium-ion battery models: a case study on the Tesla Model S battery by Hust, Friedrich Emanuel, RWTH Aachen University, published there in 2019 (DOI: 10.18154/RWTH-2019-00249), a physico-chemically motivated impedance based and real-time capable lithium-ion model is proposed and parameterized based on individual battery cells from a Tesla Model S. Among other things, the relaxation behaviour of the individual battery cells is investigated, wherein it has been found that this is caused essentially by the negative electrode, i.e., the graphite electrode. In the dissertation it is assumed that the relaxation is caused by the redistribution of lithium inside the graphite electrode. Due to this knowledge, further investigations can take place using the lithium-ion battery model with further parameterization by further real cells.

Based on this fundamental knowledge, the object of the present invention is to specify a method for determining the ageing of an individual battery cell in a lithium-ion battery, which is suitable for dynamic practical operation in order to be able to adapt the operating strategy of the battery based on the recognized ageing behaviour.

In the method according to the invention, the individual battery cell is actively charged or discharged with a power pulse, or such a power pulse charging or discharging the individual battery cell is detected during operation of the battery. On the one hand, the method can be actively initiated by triggering a corresponding power pulse for charging and/or discharging at a suitable time, for example when a battery installed in a vehicle is not currently required. In practice, however, it is probably more relevant that such a power pulse occurs during regular operation of the battery, for example when accelerating or braking sharply. This discharges or charges the battery and thus its individual battery cells as a result of recuperation. Such a power pulse during regular dynamic operation of the battery can therefore be easily detected and utilized for the method according to the invention. In an idle phase following such a power pulse, the voltage response of the individual battery cell is recorded in addition to the previous current pulse. The idle phase can be a phase with low power or also a phase without power, for example when a vehicle stops at a red light after braking sharply.

Continuous recording of current and voltage is also particularly favorable, in which, after a detected power pulse and a subsequent idle phase, the recorded data can be evaluated as described below. The decisive factor here is that a relaxation time constant is determined from this voltage response in accordance with the invention and stored. This is also fundamentally known from the dissertation on the prior art mentioned at the beginning but is not applied there in the sense described here.

The determined and stored relaxation time constants can then be used to form, in each case, a charging curve based on the most recently stored relaxation time constants and the currently determined relaxation time constant, either during charging or discharging, and a discharging curve based on further data over the charge of the individual battery cell. The charging and discharging curves then form an intersection point, which allows conclusions to be drawn about the current capacity of the individual battery cell, and in particular the graphite electrode. This provides an initial basis for determining the ageing of the individual battery cell, which then enables an operating procedure that handles the aged individual battery cells with appropriate care in order to prevent or at least minimize the progression of their ageing.

Preferably, this can be done using the transition, determined by the intersection point, from one stage of an open-circuit voltage curve of lithium versus graphite over the capacity of the individual battery cell or its graphite electrode to another stage, wherein the transition to the second stage can be detected particularly efficiently. The current capacity of the individual battery cell can then be deduced from this. If the open-circuit voltage of lithium versus graphite is plotted over the capacity of the individual battery cell, a characteristic diagram is obtained, which is known in principle from the prior art and is also discussed accordingly in the above-mentioned dissertation, in particular on pages 40 et seq. In this case, different stages within the open-circuit voltage curve are characteristic. The transition from one stage to the other allows insights about the current capacity of the individual battery cell.

The intersection point can be determined particularly efficiently if, according to a very advantageous embodiment of the method according to the invention, the charging and discharging curves are plotted with a logarithmic plot of the relaxation time constants over the charge of the individual battery cell. Essentially, two curves are then produced, i.e., a charging curve and a discharging curve, which can be approximated very well by straight lines. These form a defined intersection point, which can be used to draw relatively precise conclusions about the position of the transition, e.g., to the second stage in the open-circuit voltage curve.

If these values are now available, it is possible to use a model-based approach to calculate a current open-circuit voltage curve of lithium versus graphite from a specified open-circuit voltage curve of the individual battery cell at the beginning of its life using the current capacity of the individual battery cell. According to a very advantageous further development of the method according to the invention, the current open-circuit voltage curve is obtained for this purpose in particular by compressing the specified output curve at the beginning of the life of the individual battery cell along the direction of the capacity. In particular, this compression can be carried out until the transition to the second stage of this compressed output curve coincides with the corresponding transition of the current open-circuit voltage curve to the second stage. The transition can therefore be used as a reference point to get from a fundamentally known output curve of the individual battery cell or its graphite electrode to the current open-circuit voltage curve. This allows a current open-circuit voltage curve to be modelled with relatively high accuracy on the basis of a simple measurement that is also possible when the battery is in operation, for example in a vehicle.

The current and stored relaxation time constants are then set in relation to this simulated current voltage curve of lithium versus graphite over the state of charge of the individual battery cell. Typically, the maxima are in the area of the transitions between the individual stages, i.e., at the transition from stage 2 to stage 1, and possibly also at the transition from stage 3L to stage 4L.

In the method according to the invention, the relaxation time constants themselves can be determined directly or indirectly from the minimum voltage, the minimum charge turnover, the minimum time to achieve a more or less constant voltage of the individual battery cell and/or using a gradient, i.e., the slope, of the voltage response of the individual battery cell to the power pulse with the aid of a specified correlation of the gradient and the relaxation time constant, which can in particular be stored in a lookup table. The actual measurement of the minimum time certainly would be the preferred solution; however, it requires a relatively long idle phase. For this reason, the slope of the voltage response of the individual battery cell to the power pulse can be used in particular. Various voltages that have occurred can be assigned to certain relaxation time constants from historically known correlations, so that, for example, a reasonably reliable statement can be made about the relaxation time constant using the value stored in a table based on the slope even with a very short idle time.

According to a very advantageous further development of the method according to the invention, the currently determined relaxation time constant is compared with previously determined and stored relaxation time constants, wherein using an increase of the value of the relaxation time constants, it is deduced that there is an increase in the formation of a surface layer on the individual battery cell or its graphite electrode. Such a surface layer formation, which virtually limits the accessibility of the active material, also limits the equalization of the lithium ions, so that the relaxation time increases accordingly. An increase in the relaxation time constant over several determined values is therefore a clear indication of such an increase in the formation of a surface layer on the individual battery cell or its graphite electrode, meaning that a first concrete ageing mechanism has been recognized accordingly.

According to a further very advantageous embodiment, it can be provided that a shift in the relaxation time constants towards lower capacities, in particular in the current open-circuit voltage curve of lithium versus graphite over the capacity of the individual battery cell, is used to deduce an increasing loss of active material of the anode. Such a shift, in particular in the above-mentioned diagram of the current open-circuit voltage curve in the direction of lower capacities, i.e., in such a diagram in the x-direction to the left, represents an increasing loss of active material of the anode. This second concrete ageing mechanism is also referred to as LAAM (loss of active anode material).

A further very advantageous embodiment of the method according to the invention also makes it possible, as an alternative or in addition to the two previous ageing mechanisms, to deduce an increasing loss of lithium on the basis of a reduction in the distance between the current relaxation time constant and the most recently stored relaxation time constants compared to the distance between previously stored pairs of relaxation time constants over the capacity, and here again in particular in the current open-circuit voltage curve of lithium versus to graphite over the capacity of the individual battery cell. The increasing loss of lithium, LLi, can therefore be recognized when the distance between the individual relaxation time constants in the diagram becomes smaller. This means the relaxation time constants move closer together in relation to the capacity axis. So, a third ageing mechanism can be concretely recognized.

All three described mechanisms can be determined together or independently of each other in the model-based evaluation of the detected relaxation time constants. Each of the ageing mechanisms has a different influence on the relaxation time constant, so that all three ageing mechanisms can be read from the measured values. If the specific ageing mechanism in the individual battery cell or its graphite electrode is known, it is now possible to counteract this ageing mechanism in a very targeted manner. For example, the power supply to and the power consumption from the battery can be adjusted when charging and discharging during operation, or the cooling or temperature control of the battery can be changed, in order to operate the individual battery cells in a correspondingly gentle manner.

With reference to the current open-circuit voltage curve of the individual battery cell obtained by the model-based analysis, this method according to the invention for controlling the power supply to and the power consumption from the battery could be adapted in such a way that charging and discharging the respective individual battery cell beyond the limit of the stages of the open-circuit voltage curve is avoided as far as possible. Whenever possible, charging and discharging should therefore take place within one of the stages; only in exceptional cases should these be exceeded. As a result, the progression of ageing of the individual battery cell, and here in particular its graphite electrode, can be accordingly stopped or minimized.

Further advantageous embodiments of the two methods according to the invention result from the exemplary embodiments and are explained in more detail using the figures below.

DETAILED DESCRIPTION OF THE DRAWINGS

Figure 1:
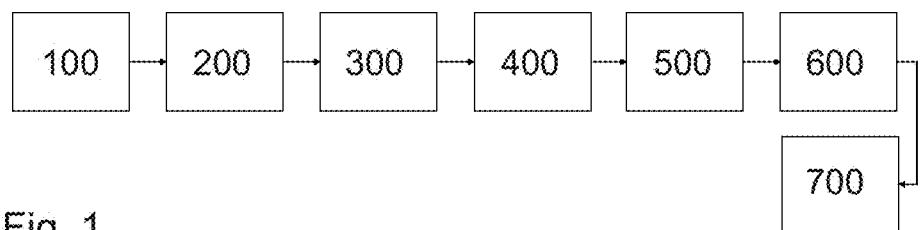
FIG. 1 shows a schematic representation of the method sequence for a possible embodiment of the method according to the invention.
Figure 2:
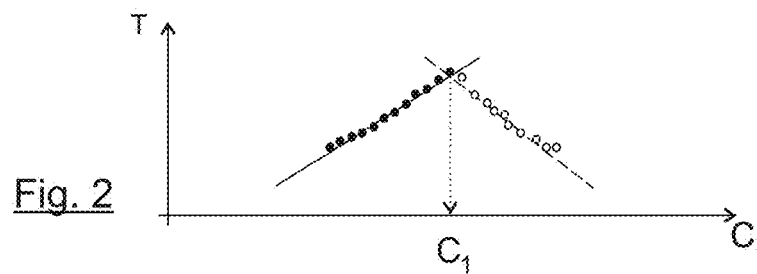
FIG. 2 shows a representation of the correlation between charging and relaxation time constants.

In the representation of FIG. 1, a possible method sequence for determining the ageing of an individual battery cell, and a change based thereon of the operating method for the battery, is schematically represented. In the box marked with 100, for example a strong current consumption, i.e., a power pulse, in a battery or at least one of its individual battery cells is detected. In the box 200, the current pulse and the voltage response of the individual battery cell thereto are recorded. In a following phase with a lower or with no power consumption or supply, which here is referred to as an idle phase, an evaluation of the relaxation of the individual battery cell takes place. In step 400, a relaxation voltage and a relaxation time constant are calculated, as is known in principle from the above-mentioned dissertation. In step 500, a correlation is made between the charging C and different relaxation time constants τ, which have already been detected and stored and/or have been currently determined. This will be discussed in more detail below in the context of FIG. 2.

Optionally, in step 600 a model-based ageing determination can take place, in which different ageing mechanisms, for example a surface layer formation, LAAM and/or LLi can be detected and thus is particularly advantageous. This will be discussed in more detail in FIGS. 4 to 6. Similarly, in the optional step 700, these recognized ageing mechanisms can now be used in order to choose a correspondingly suitable operation strategy for the battery, i.e., to avoid specific operating states, and to operate the battery both in relation to the charging, the discharging and in relation to its temperature control via a cooling medium as gently as possible, in order to prevent progressive ageing or at least decelerate the progress.

Different calculated relaxation time constants t which occurred, for example, during a power pulse used for charging or discharging, have been calculated and stored in step 400. According to step 500, the individual relaxation time constants t are plotted over the charge C in FIG. 2, resulting in a logarithmic scale for the relaxation time constants t along the points shown in black for the charging cycles and along the points shown in white for the discharging cycles. Their intersection point then allows conclusions to be drawn about the current capacity K of the individual battery cell or its graphite electrode (anode), which essentially determines the ageing mechanism, via the resulting charge $C_1$.

Figure 3:
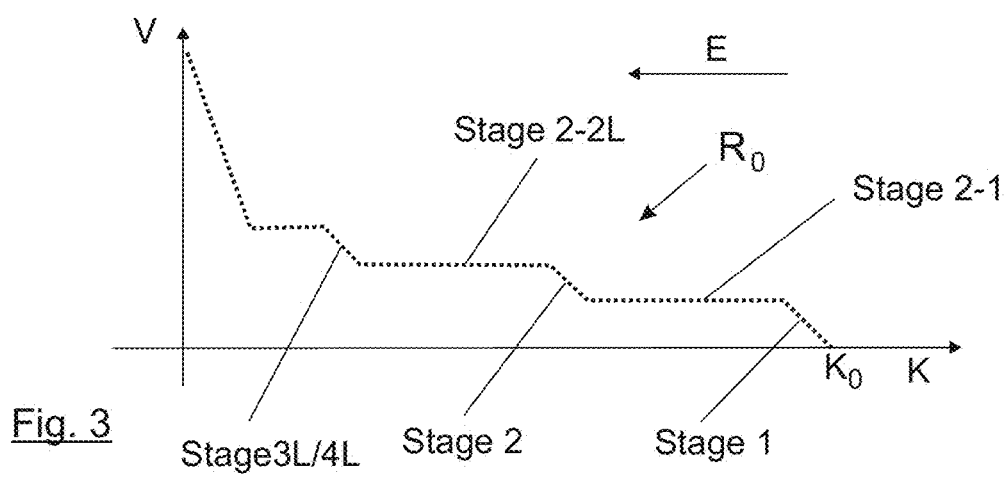
FIG. 3 shows a basic open-circuit voltage diagram of a lithiated graphite electrode.

In the representation of FIG. 3, a schematic open-circuit voltage curve $R_0$ of lithium versus graphite over the capacity K of the individual battery cell or its graphite electrode is shown. Here the open-circuit voltage position V is plotted on the y-axis and the cell capacity K of the lithiated graphite electrode with normalization to stage 3L or stage 4L (see below) is plotted on the x-axis. In FIG. 3, the open-circuit voltage curve $R_0$ is that of a new individual battery cell or graphite electrode. The initial capacity of the individual battery cell or its graphite electrode is indicated here with $K_0$ at the beginning of its life. The open-circuit voltage of zero at the point of the initial capacity $K_0$ shows the fully charged state, i.e., the final charge direction E of the entire cell is shown here from right to left. The open-circuit voltage curve $R_0$ has characteristic stages. These are referred to from right to left along the capacity as stage 1, stage 2-1, stage 2L-2, stage 3L/4L.

An open-circuit voltage curve $R_1$ with the current capacity $K_1$ can now be modelled into this open-circuit voltage curve $R_0$ known with the initial capacity $K_0$. The open-circuit voltage curve $R_1$ with the current capacity $K_1$ is compressed accordingly towards the capacity K from the output curve with initial capacity $K_0$. The aged capacity $K_1$ is therefore below the initial capacity $K_0$, whereby different things can be read at the different points of these open-circuit voltage curves $R_0$, $R_1$.

In science, it is known that a loss of anode active material (LAAM) causes the capacity K to shrink from the right, so a fully lithiated graphite electrode is reached more quickly. On the left side, a reduction of the capacity K is caused by the loss of lithium (LLi). In the following, we will look at how these two effects impact the relaxation time constant t and also discuss an effect on the formation of surface layers.

Figure 4:
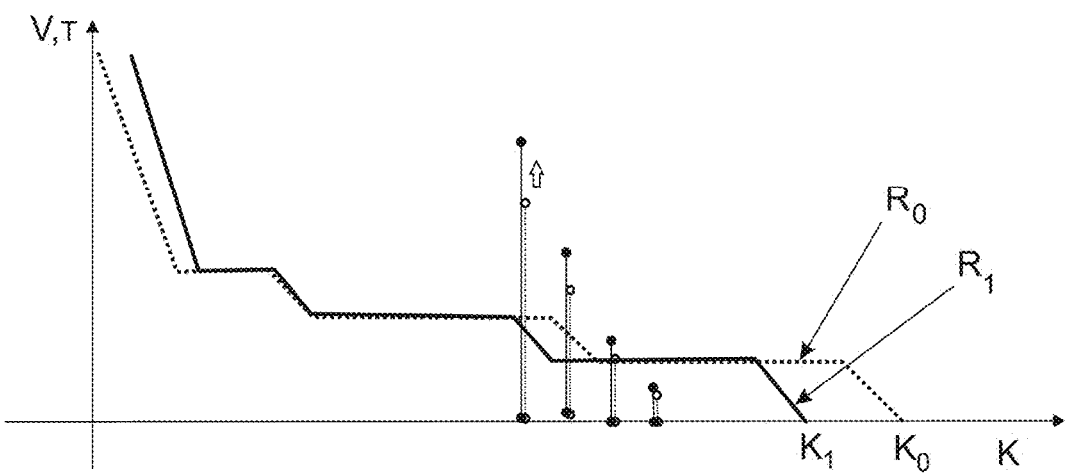
FIG. 4 shows the open-circuit voltage diagram according to FIG. 3 with additionally marked open-circuit voltage curve of an aged individual battery cell and with additionally marked detected and stored relaxation time constants in the case of a surface layer formation.
Figure 5:
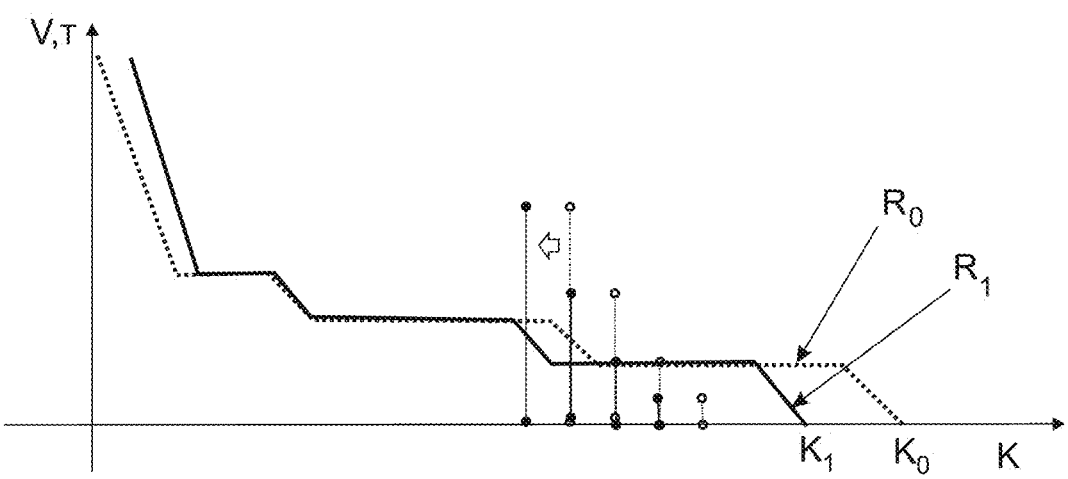
FIG. 5 shows the open-circuit voltage diagram according to FIG. 3 with additionally marked open-circuit voltage curve of an aged individual battery cell and with additionally marked detected and stored relaxation time constants in the case of a loss of anode active material (LAAM)
Figure 6:
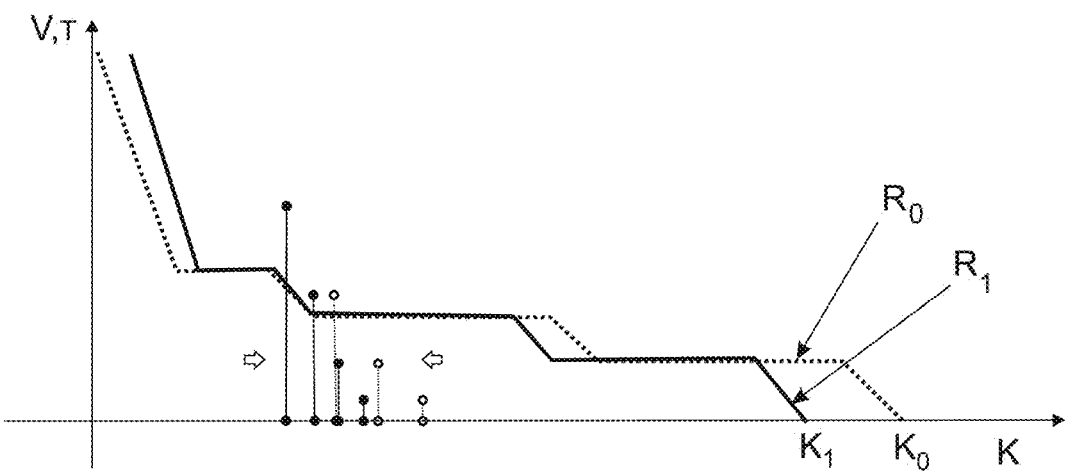
FIG. 6 shows the open-circuit voltage diagram according to FIG. 3 with additionally marked open-circuit voltage curve of an aged individual battery cell and with additionally marked detected and stored relaxation time constants in the case of a lithium loss (LLi)

FIGS. 4 to 6 each show two schematic open-circuit voltage curves $R_0$, $R_1$ of the lithiated graphite electrode. An unaged open-circuit voltage curve $R_0$ represented with a dotted line (analogous to FIG. 3) and an aged open-circuit voltage curve $R_1$ represented with a solid line. The y-axis represents the time of the relaxation time constants t in seconds and the open-circuit voltage position V against lithium. On the x-axis, the capacity K is again shown with normalization to stage 3L/4L. The position of the open-circuit voltage curve $R_1$ with an aged graphite electrode results from the current charge $C_1$ detected via the diagram explained in FIG. 2 and the aged capacity derived from it.

Along with the open-circuit voltage curve $R_0$, $R_1$ of the new and the aged graphite electrode, in the diagram of FIG. 4, the relaxation time constants t are also marked. The relaxation time constants t of the new graphite electrode are shown with dotted lines running from zero to the corresponding relaxation time constant τ, analogous to the representation of the open-circuit voltage curve $R_0$, and those of the aged individual battery cell are shown with a solid line.

It can be seen in the diagram of FIG. 4 that the relaxation time constants t of the aged graphite electrode take higher values than those of the new graphite electrode in the corresponding position. Such an increase of the relaxation time constants τ indicates an increasing surface layer formation as one of the ageing mechanisms in the graphite electrode.

FIG. 5 shows the effect of LAAM on the relaxation time constant τ, analogous to the representation in FIG. 4. With the decrease of the capacity K, caused by LAAM, the relaxation time constant τ shifts to a lower state of charge (in relation to the initial capacity). The relaxation time constants τ are again shown by the data points. In this case, the dotted data points of the original (fresh) state and the solid data points represent the relaxation time constants τ shifted by ageing.

FIG. 6 shows the effect of LLi on the relaxation constant τ, analogous to the representation in the previous FIGS. 4 and 5. The steepness with which the relaxation time constants τ increase increases with lithium loss. If the relaxation constant τ is now determined at several points during discharge, the degree of lithium loss can be deduced from the steepness of the change in the time constant. The group of recorded relaxation time constants τ of the new graphite electrode are again shown as dotted lines, those of the aged graphite electrode with solid lines. The distances between the values within the group have decreased due to ageing, the group has been pushed together.

The mechanisms shown in the three FIGS. 4, 5 and 6 can therefore be easily recognized automatically in the modelled data on the basis of the recorded measured values. Typically, all three mechanisms are superimposed on each other, but this is not disruptive, as the three ageing mechanisms have such significantly different influences on the relaxation time constant τ that they can be easily and efficiently read from the available data even if they are superimposed.

Figure 7:
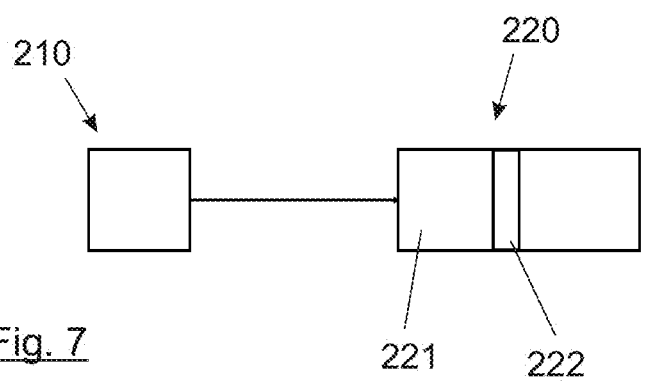
FIG. 7 shows a schematic representation of a buffer concept for carrying out the method according to FIG. 1.

As soon as a large power consumption is detected in the process sequence shown in FIG. 1 (box 100), a recording 200 of the current value through the battery or individual battery cell and the voltage value of the individual battery cell is started. Advantageously, this recording 200 is carried out continuously and with high recording dynamics. This can take place in a first buffer 210, shown schematically in FIG. 7, with high dynamics. After detection of an event suitable for evaluation consisting of a power pulse and subsequent idle phase, the recorded data is transferred from the first buffer 210 to a second buffer 220 and stored there as a copy 221. Recording 200 is then continued in the second buffer 220 with a lower dynamic range, which is illustrated here by the area 222. This means that a power pulse can also be evaluated retrospectively and has a lower storage consumption for the period with a lower dynamic range (during relaxation).

Recording is continued until a cancellation criterion is reached. This can be, for example, a minimum voltage change per time, a minimum charge turnover (only higher turnovers make sense for inhomogeneity) or a minimum time.

The relaxation voltage and the relaxation time constant τ can then be calculated. The relaxation time constant τ can then be inserted into a table that links, for example, the charge C, the state of charge SOC or the capacity K with the relaxation time constant τ. This can be carried out both for discharging and charging pulses. Several of these relaxation time constants τ can then be used to correlate the behaviour of discharge and charge pulses, e.g., by regression analysis, in order to find the intersection point between the maximum relaxation time constant τ in the discharge and charge direction. (FIG. 2) The transition point is located at this point and can be used to evaluate LLi and LAAM. This can be done for stage 3L/4L as well as stage 2 and stage 1 in order to quantify the development of the different ageing effects.

With the aid of the quantification, the operating limits and operating strategy can now be adjusted in step 700 of the method. This could be, for example, limiting the charging or discharging current due to ageing or adapting the operating strategy to utilize a medium operating window. It is also conceivable that the calculated ageing variables result in a higher requirement for cooling or heating and a corresponding adjustment of the thermal strategy.

In particular this method is useful if it is aggregated across a vehicle fleet and analysed in a backend server. In addition to the usual evaluation criteria (capacity, resistance), the homogeneity of the lithium distribution in the different stages can also be evaluated.

The invention claimed is:

1. A method for determining ageing of an individual battery cell of a lithium-ion battery, comprising:
the individual battery cell is actively charged or discharged with a power pulse, or such a power pulse charging or discharging the individual battery cell is detected during operation of the lithium-ion battery, wherein an occurring current pulse and a voltage response of the individual battery cell are recorded in an idle phase following the power pulse with lower power or without power and a relaxation of the individual battery cell is evaluated, wherein at least a relaxation time constant ($\tau$) is determined and stored, after which in each case a charging curve and a discharging curve is formed over the charge of the individual battery cell from the currently detected and already stored relaxation time constant ($\tau$) when charging or discharging the individual battery cell by the power pulse, wherein a current capacity ($K_1$) of the individual battery cell is deduced on a basis of a point where the charging curve and the discharging curve intersect.

2. The method according to claim 1, wherein the current capacity ($K_1$) of the individual battery cell is deduced from a transition, determined by the intersection point, from one stage to another stage on an open-circuit voltage curve ($R_0$, $R_1$) of lithium versus graphite over a capacity (K) of the individual battery cell.

3. The method according to claim 1, wherein the charging curve and the discharging curve are formed by plotting the relaxation time constants ($\tau$) logarithmically over the charging of the individual battery cell.

4. The method according to claim 2, wherein a current open-circuit voltage curve ($R_1$) of lithium versus graphite over the capacity (K) of the individual battery cell from a specified open-circuit voltage curve ($R_0$) is calculated at a beginning of a life of the individual battery cell using the current capacity ($K_1$) of the individual battery cell.

5. The method according to claim 4, wherein the current open-circuit voltage curve ($R_1$) is determined by compressing the specified output curve ($R_0$) along a direction of the capacity (K) until the determined transition between two of the coincides with the corresponding transition of the current open-circuit voltage curve ($R_0$).

6. The method according to claim 4, wherein the current and the stored relaxation time constants ($\tau$) are set in relation to the current open-circuit voltage curve ($R_0$).

7. The method according to claim 1, wherein the relaxation time constant ($\tau$) is determined directly or indirectly from a minimum voltage, a minimum charge turnover, a minimum time to achieve a more or less constant voltage of the individual battery cell and/or using a gradient of the voltage response of the individual battery cell with aid of a specified correlation of the gradient and the relaxation time constant ($\tau$) from a table.

8. The method according to claim 1, wherein the currently determined relaxation time constant ($\tau$) is compared with previously determined and stored relaxation time constants ($\tau$), wherein using an increase of a value of the relaxation time constants (τ), it is deduced that there is an increase in a formation of a surface layer on the individual battery cell.

9. The method according to claim 1, wherein a shift in the relaxation time constants (τ) towards lower capacities (K) is used to deduce an increasing loss of anode active material (LAAM).

10. The method according to claim 1, wherein a reduction in a distance between the current relaxation time constant (τ) and the most recently stored relaxation time constant (τ) compared to the distance between previously stored pairs of relaxation time constants (τ) over the capacity (K) is used to deduce an increasing loss of lithium (LLi).

11. A method for controlling a battery with at least one individual battery cell, for which the ageing has been determined according to the method according to claim 1, comprising:
    a power supply to and power consumption from a battery is adjusted when charging and discharging during operation such that recognized ageing mechanisms are counteracted or at least not amplified.

12. The method according to claim 11, wherein charging and discharging the respective individual battery cell beyond a limit of its stages in the open-circuit voltage curve of lithium versus graphite over a capacity of the individual battery cell is avoided as far as possible.

13. The method according to claim 11, wherein a heat management of the battery during operation is adjusted such that recognized ageing mechanisms are counteracted or at least not amplified.

* * * * *